(12) United States Patent
Xu et al.

(10) Patent No.: US 7,427,736 B2
(45) Date of Patent: Sep. 23, 2008

(54) METHOD AND APPARATUS FOR PROVIDING A ROLLING DOUBLE RESET TIMING FOR GLOBAL STORAGE IN IMAGE SENSORS

(75) Inventors: Chen Xu, Boise, ID (US); Parker Altice, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 13 days.

(21) Appl. No.: 11/386,678

(22) Filed: Mar. 23, 2006

(65) Prior Publication Data

US 2007/0221823 A1  Sep. 27, 2007

(51) Int. Cl.
H01L 27/00 (2006.01)
H04N 9/64 (2006.01)
H04N 5/217 (2006.01)

(52) U.S. Cl. .................. 250/208.1; 348/241; 348/243

(58) Field of Classification Search ............... 250/208.1; 348/241, 243, 308, 302; 257/239
See application file for complete search history.

(56) References Cited

U.S. PATENT DOCUMENTS

2004/0051801 A1  3/2004  Iizuka et al.
2005/0110093 A1*  5/2005  Altice et al. ............... 257/359
2006/0044437 A1  3/2006  Shah
2006/0108614 A1*  5/2006  Yi et al. ..................... 257/239

FOREIGN PATENT DOCUMENTS

WO  WO 02/30101 A1  4/2002

* cited by examiner

Primary Examiner—Thanh X Luu
Assistant Examiner—Brian J Livedalen
(74) Attorney, Agent, or Firm—Dickstein Shapiro LLP

(57) ABSTRACT

An apparatus for and a method of operating an array of pixels of an image sensor, where each pixel includes at least a photosensor, an associated storage device and a floating diffusion region and the array of pixels is configured in a plurality of rows and columns. The photosensors associated with the pixels are reset and charges are accumulated in the photosensor. The accumulated charges are then globally transferred to storage devices associated with the pixels. A rolling double reset is used to reduce the deleterious effects on the accumulated charges stored in the storage devices. The accumulated charges stored in the storage devices are transferred to floating diffusion regions associated with the pixels and the charges residing in the floating diffusion region are read out. In a second embodiment the storage device is eliminated and the rolling double reset is used to reduce the deleterious effects on the accumulated charges stored in the floating diffusion region.

8 Claims, 12 Drawing Sheets

METHOD AND APPARATUS FOR PROVIDING A ROLLING DOUBLE RESET TIMING FOR GLOBAL STORAGE IN IMAGE SENSORS

FIELD OF INVENTION

The present invention relates generally to semiconductor imagers. More specifically, the present invention relates to a novel timing methodology to improve the performance of global storage in imagers.

BACKGROUND OF THE INVENTION

An imager, for example, a CMOS imager includes a focal plane array of pixels; each pixel includes a photosensor, for example, a photogate, photoconductor or a photodiode overlying a substrate for producing a photo-generated charge in a doped region of the substrate. A readout circuit is provided for each pixel and includes at least a source follower transistor and a row select transistor for coupling the source follower transistor to a column output line. The pixel also typically has a floating diffusion region, connected to the gate of the source follower transistor. Charge generated by the photosensor is sent to the floating diffusion region. Imagers incorporating global storage include a transistor for transferring charge from the photosensor to a storage node, and a transistor for transferring charge from the storage node to the floating diffusion region (unless the floating diffusion region is also serving as the storage region). The imager also includes a transistor to reset the floating diffusion region. The imager may include a transistor to reset the photodiode.

FIG. 1 is an illustration of a conventional four transistor (4T) pixel 100 typically used in a CMOS imager. The pixel 100 includes a photosensor 105, shown as a photodiode, a floating diffusion charge storage region (floating diffusion region) 110, and four transistors: a transfer transistor 115, a reset transistor 120, a source follower transistor 125, and a row select transistor 130. The pixel 100 accepts a TX control signal for controlling the conductivity of the transfer transistor 115, a RST control signal for controlling the conductivity of the reset transistor 120, and a ROW control signal for controlling the conductivity of the row select transistor 130. The charge stored at the floating diffusion region 110 controls the conductivity of the source follower transistor 125. The output of the source follow transistor 125 is presented at node 135, which is connected to a column line of a pixel array, when the row select transistor 130 is conducting.

The states of the transfer and reset transistors 115, 120 determine whether the floating diffusion region 110 is coupled to the light sensitive element 105 for receiving photogenerated charge accumulated by the light sensitive element 105 during a charge integration period, or a source of pixel power VAAPIX from node 140 during a reset period.

The pixel 100 is operated as follows. The ROW control signal is asserted to cause the row select transistor 130 to conduct. At the same time, the RST control signal is asserted while the TX control signal is not asserted. This couples the floating diffusion region 110 to the pixel power potential VAAPIX at node 140, and resets the voltage at this floating diffusion region 110 to the pixel power potential VAAPIX, less a voltage drop associated with reset transistor 120. This voltage drop can be avoided by boosting the reset signal. The pixel 100 outputs a reset signal (Vrst) at node 135. As will be explained in greater detail below in connection with FIG. 2, node 135 is typically coupled to a column line 235 (FIG. 2) of an imager 200, which supplies a constant current through the source follower transistor 125.

While the transfer transistor 115 is off, the photosensor 105 is exposed to incident light and accumulates charge based on the level of the incident light during a charge integration period. After the charge integration period and after the RST control signal turns off reset transistor 120, the TX control signal is asserted. This couples the floating diffusion region 110 to the photosensor 105. Charge flows through the transfer transistor 115 and diminishes the voltage at the floating diffusion region 110 in accordance with the accumulated charge and the capacitance of the floating diffusion node. The pixel 100 thus outputs a photo signal (Vsig) at node 135.

FIG. 2 is an illustration of an imager 200 that includes a plurality of pixels 100 forming a pixel array 205. Due to space limitations the pixel array 205 is drawn as a 4 row by 4 column array in FIG. 2. One skilled in the art would recognize that most imagers 200 would ordinarily include many more pixels 100 in the array. The imager 200 also includes row circuitry 210, column circuitry 215, a digital processing circuit 220, and a storage device 225. The imager 200 also includes a controller 230, for controlling operations of the imager 200.

The row circuitry 210 selects a row of pixels 100 from the pixel array 205. The pixels 100 in the selected row output their reset and pixel signals Vrst, Vsig to the column circuitry 215, via column output lines 235, which samples and holds the reset and pixel signals Vrst, Vsig for each pixel in a row. The rows are activated one by one in sequence to send successive row signals to column output lines 235.

The column circuitry 215 is responsible for converting the pixel reset Vrst and photo Vsig signals into digital values that can then be further processed in the digital domain. In order to do this, the column circuitry 215 samples and holds the reset Vrst and photo Vsig signals produced by each pixel. An analog pixel output signal (Vpixel) is formed as the difference between the reset Vrst and photo Vsig signals, i.e., Vpixel=Vrst−Vsig. The pixel output signal Vpixel is then converted into a digital value. Imager 200 uses a column parallel architecture, in which the outputs of several pixels 100 in the selected row are simultaneously sampled and held, and converted to digital values. The digital values are output to the digital processing circuit 220, which performs image processing on the digital values to produce a digital image. The processed digital values are stored in the storage device 225. The controller 230 is coupled to the pixel array 205, row circuitry 210, column circuitry 215, and storage device 225, and provides control signals to perform the above described processing.

One way of providing a global shutter function is the addition of a storage gate transistor between the photosensor 105 and transfer gate 115. Such a structure is illustrated in FIG. 3, which illustrates a storage gate transistor 305 and associated storage node SN 315 provided in series between the photosensor 310 and transfer transistor 325. As one of ordinary skill in the art would appreciate, the storage node SN is not necessary in all global shutter devices. The "FD Global Shutter" stores the image on the floating diffusion transistor at the expense of correlated double sampling. As illustrated below, the invention described here also works with "FD Global Shutter" pixels. One of ordinary skill in the art would appreciate that the current invention is applicable to other types of global storage including storage node pixel and shutter pixel.

Typically, one problem encountered when storage nodes are used with, for example, imagers including global storage, is the presence of an increased amount of dark current. This may be caused by surface generation of the dark current or dark current resulting from process induced damage. The dark current of the storage node of global storage pixels may be as much as twenty times greater than the dark current experienced in a pinned photodiode used as a pixel photosensor. A second problem encountered with global storage pixels is leakage charge (or smear charge) which is the combination of optical and electrical crosstalk to the storage node resulting in a low shutter efficiency (SE). Once the charge stored in the storage node is readout during the readout phase, dark current and smear charge begin to re-accumulate in the storage node prior to the occurrence of the next readout phase. The presence of dark current and leakage charge significantly degrades the image quality. The image quality is especially degraded in low light conditions when the frame rate is reduced to accommodate a longer integration time.

BRIEF SUMMARY OF THE INVENTION

The present invention provides a new timing method and apparatus which improves the performance of global storage techniques. When a storage node is used for global storage, the timing method and apparatus helps to significantly reduce the dark current and the leakage charge generated in the storage node by using two rolling resets where one of the resets sweeps out the residue charge in the storage node prior to charge transfer from the storage node to the floating diffusion region. This rolling double reset minimizes the time between resets of the storage node and maintains a constant amount of time between resets of the storage node associated with different rows of the pixel array. This rolling double reset timing strategy reduces the dark current shading effects and shutter inefficiency effects. When the floating diffusion node is used for storing charge with a global shutter function, the timing method and apparatus also helps to significantly reduce the dark current generated in the floating diffusion node by using two rolling resets where a rolling shutter reset sweeps residue charge from the floating diffusion node prior to charge transfer from the photosensor and the storage node is effectively reset a second time when the charge is transferred from the floating diffusion node to the column select output line.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF THE INVENTION

In the following detailed description, reference is made to the accompanying drawings, which are a part of the specification, and in which is shown by way of illustration, various embodiments whereby the invention may be practiced. These embodiments are described in sufficient detail to enable those skilled in the art to make and use the invention. It is to be understood that other embodiments may be utilized, and that structural, logical, and electrical changes, as well as changes in the materials used, may be made without departing from the spirit and scope of the present invention.

The term "substrate" is to be understood as referring to wafers or substrates including silicon, silicon-on-insulator (SOI) or silicon-on-sapphire (SOS), doped and undoped semiconductors, epitaxial layers of silicon supported by a base semiconductor foundation, and other semiconductor structures. Furthermore, when reference is made to a "substrate" in the following description, previous process steps may have been utilized to form regions, junctions or material layers in or on the base semiconductor structure or foundation. In addition, the semiconductor need not be silicon-based, but could be based on silicon-germanium, germanium, gallium arsenide, or other known semiconductor materials.

The term "pixel" refers to a photo-element unit cell containing a photoconversion device or photosensor and transistors for processing an electrical signal from electromagnetic radiation sensed by the photoconversion device. The pixels discussed herein are illustrated and described as inventive modifications to six transistor (6T) pixel circuits for the sake of example only. It should be understood that the invention may be used with other pixel arrangements. Although the invention is described herein with reference to the architecture and fabrication of one pixel, it should be understood that this is representative of a plurality of pixels in an array of an imager device. In addition, although the invention is described below with reference to a CMOS imager, the invention has wider applicability. The following detailed description is, therefore, not to be taken in a limiting sense, and the scope of the present invention is defined only by the appended claims.

Figure 1:
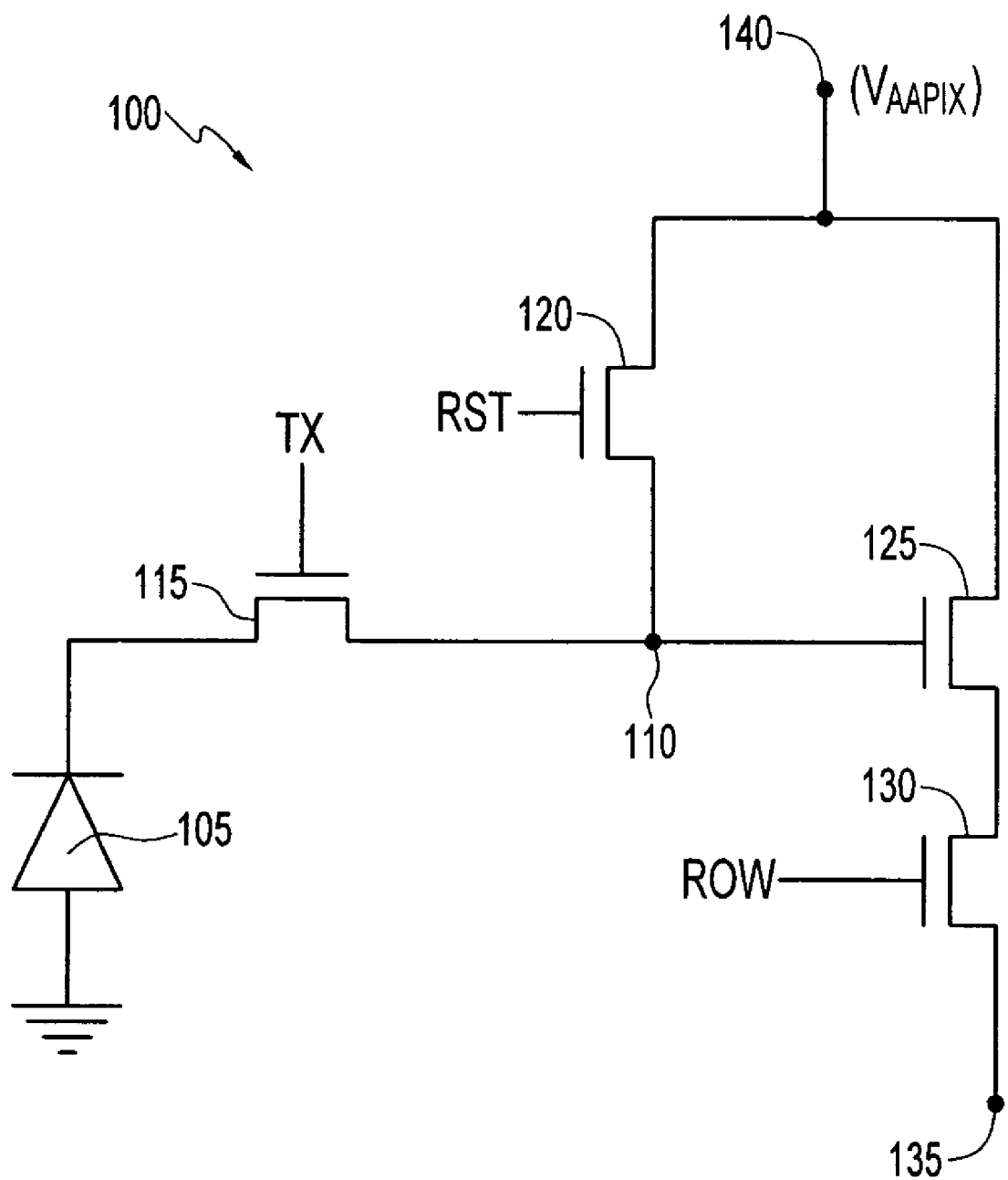
FIG. 1 illustrates a conventional imager pixel.
Figure 2:
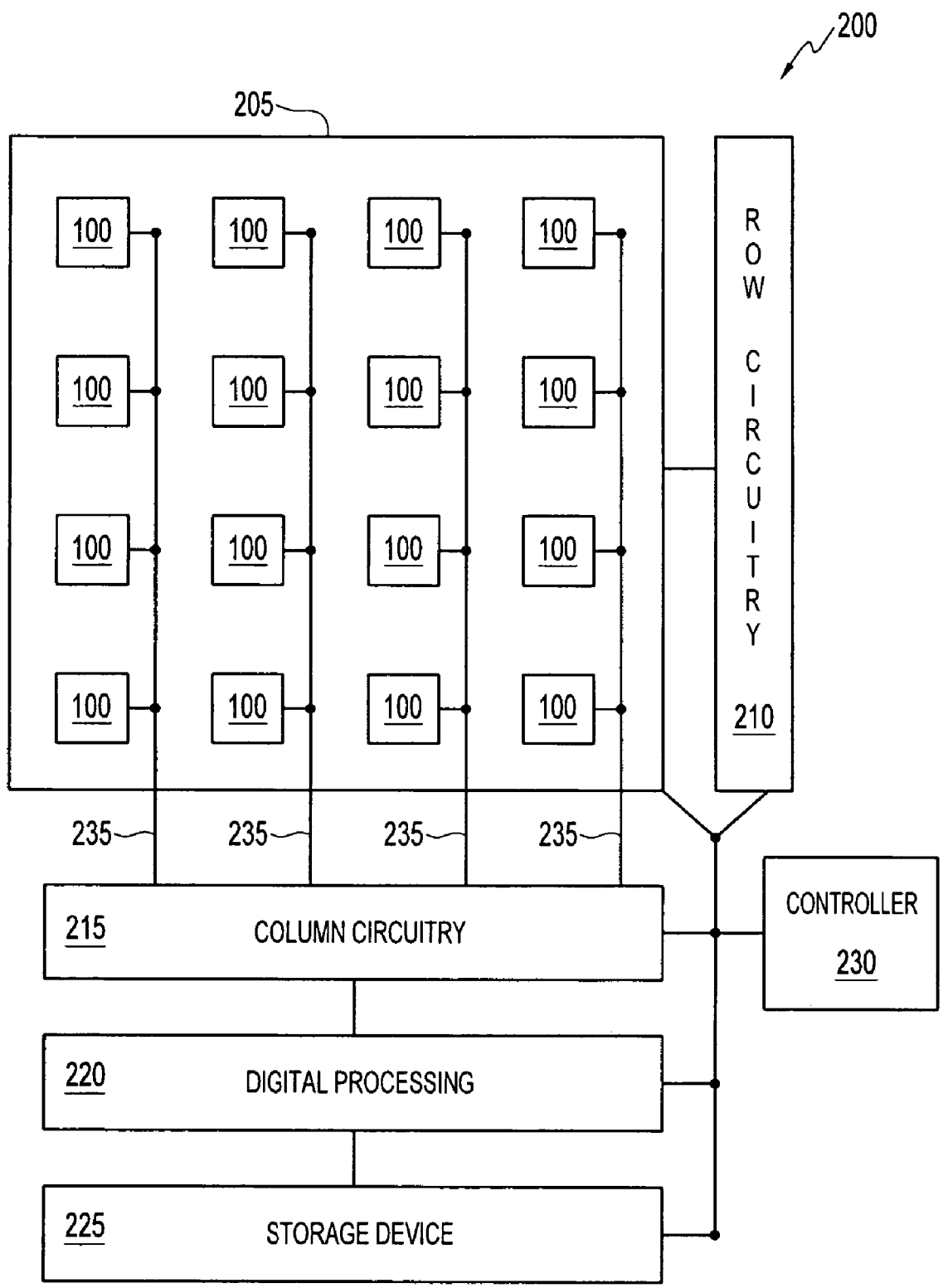
FIG. 2 illustrates an imager utilizing the imager pixel of FIG. 1.
Figure 3:
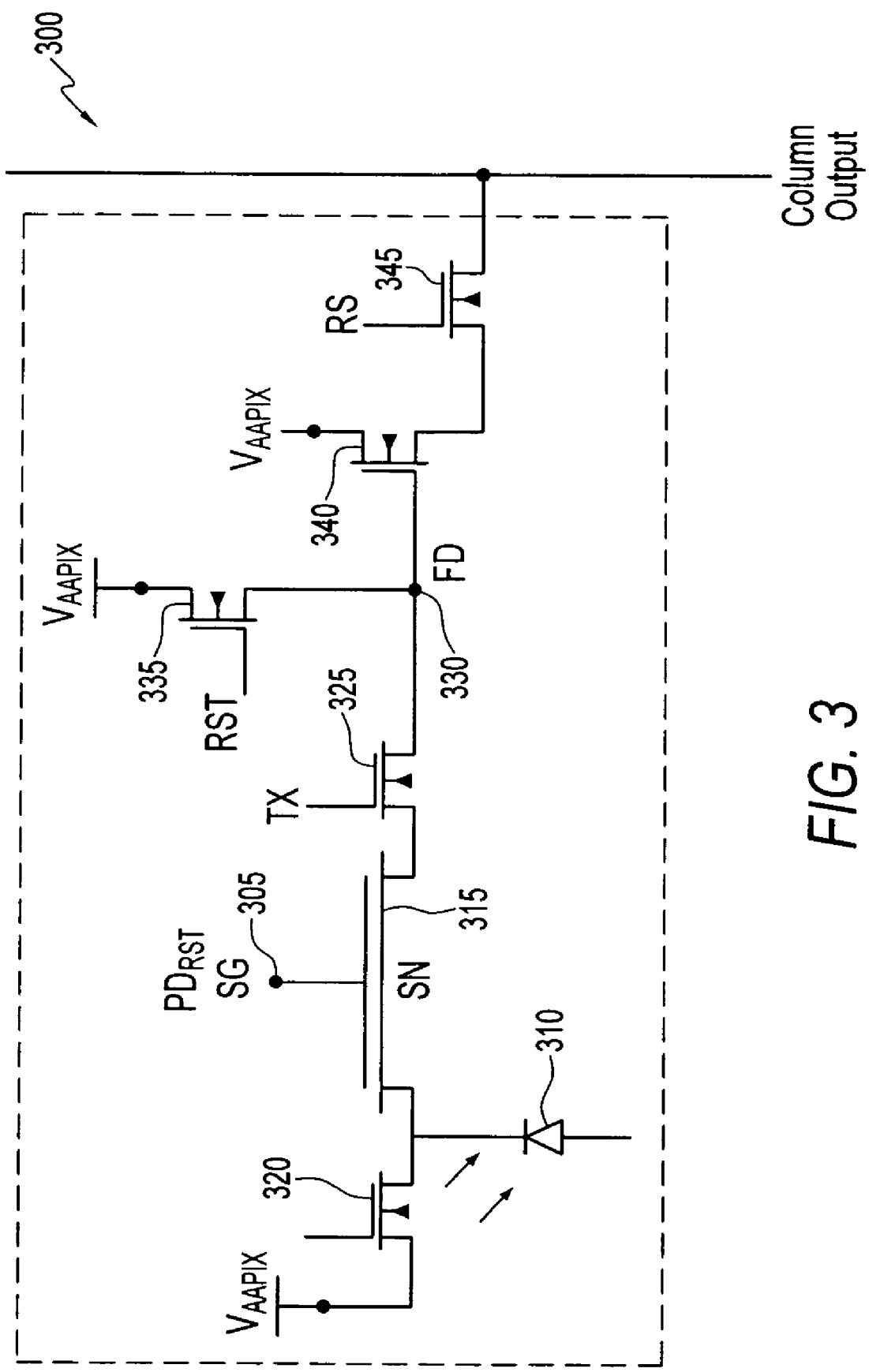
FIG. 3 is a schematic circuit diagram of imager pixel including a global shutter device.

FIG. 3 is an embodiment of a pixel circuit 300 having a global shutter. Shutter gate 305 is used to transfer charge from the photosensor 310 to the storage node 315. When a global shutter is used, the charge transfers from all photosensors 310 to the storage node 315 for all of the pixel circuits 300 of the pixel array at the same time. Photosensor reset (PDRST) gate 320 is used to reset the photosensor 310. Transfer transistor 325 transfers charge from the storage node 315 to the floating diffusion region 330. In pixel circuit 300, the transfer of charge from storage node 315 to the floating diffusion region 330 effectively resets the storage node 315. Pixel circuit 300 also includes reset transistor 335, source follower transistor 340 and row select transistor 345.

Figure 4:
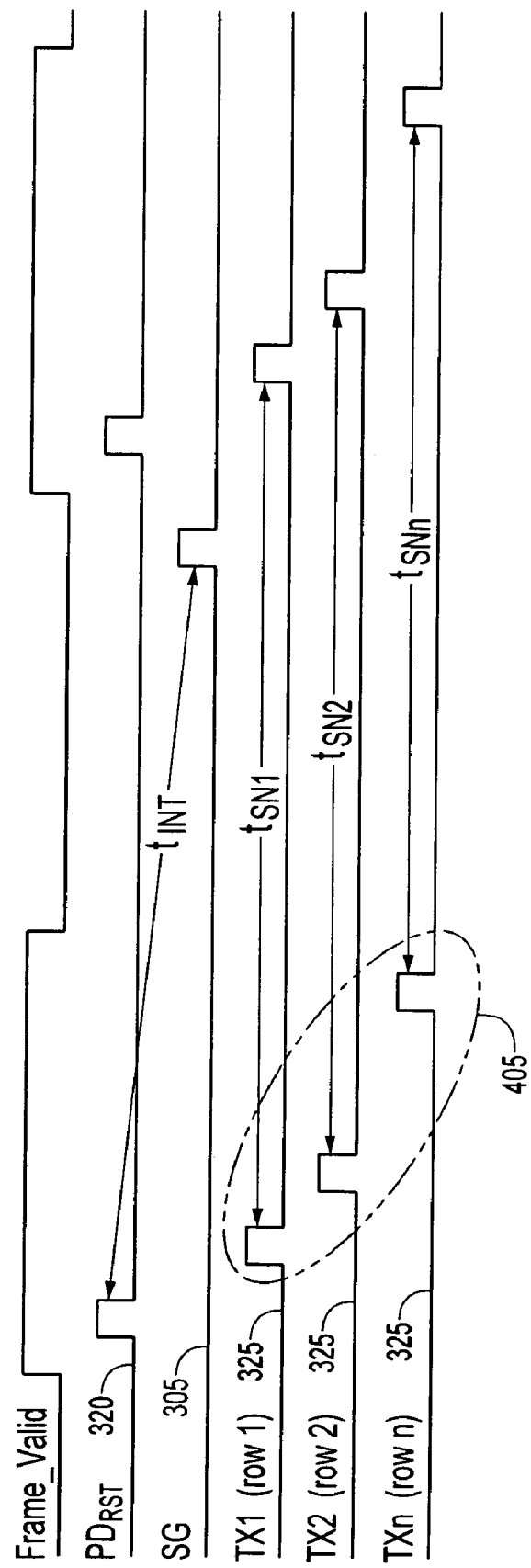
FIG. 4 is a timing diagram of a charge readout for the pixel of FIG. 3.

FIG. 4 is a timing diagram of the global shutter pixel circuit 300 of FIG. 3. $PD_{RST}$ 320 is globally pulsed on to reset photosensor 310 to VAAPIX less the voltage drop across the photosensor reset gate 320. During an integration time ($t_{INT}$), charge is accumulated in photosensor 310 of the pixel array. When shutter gate 305 is globally pulsed on, the charge accumulated in all of the photosensors 310 of the pixel array are transferred to their respective storage nodes 315. Once the charges are stored in the storage nodes 315, the charges for each storage node 315 are read out row by row in a rolling readout. Reading out the charge stored in the storage node 315 effectively resets the storage node. As shown by FIG. 4, the storage node is only reset during the readout. Consequently, the storage nodes of the pixel array are reset row by row during readout resulting in a rolling reset 405. Dark current and leakage (or smear) current affect the storage node at all times whether a charge is stored in the storage node or not. As shown by FIG. 4, the time between resets of the storage nodes in pixel circuit 300 are approximately equal ($t_{SN1}=t_{SN2}=t_{SNn}$) across the rows of the pixel array. Since the $t_{SN}$'s are approximately equal, the affects of dark current and leakage current are approximately the same for pixel circuit 300 in the pixel array. $t_{SN}$ is dependent on both the readout time (the time when Frame_Valid is high) and the vertical blanking time (time when the Frame_Valid is low).

Figure 5:
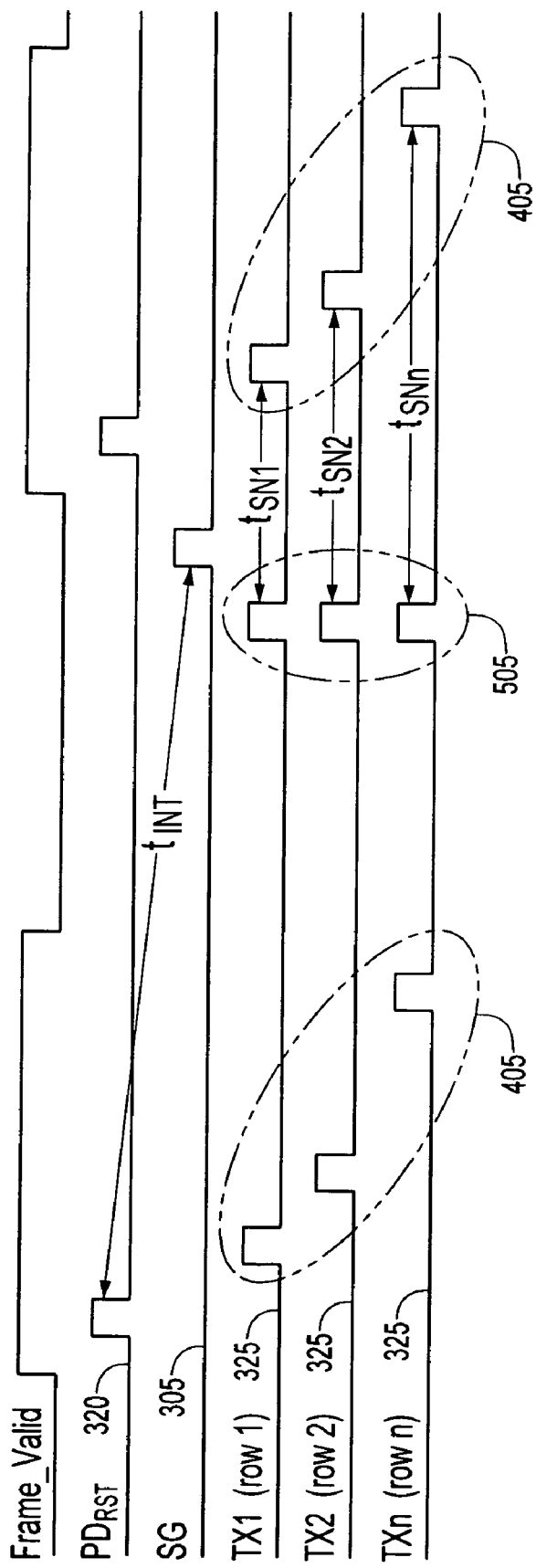
FIG. 5 is a timing diagram of a charge readout for the pixel of FIG. 3 including a global reset of the storage nodes.

FIG. 5 is a timing diagram of a charge readout for the pixel circuit 300 of FIG. 3 including a global reset of the storage nodes. During the time charges are accumulated in the photosensors 310 of the pixel array, but before the charges are transferred to the associated storage nodes 315, all of the storage nodes 315 of the pixel array are reset with a global storage node reset 505. The global storage node reset 505 occurs by biasing each of the transfer transistors 325 on at the same time. Thus, before charge is transferred from each of the photosensors 310 of the pixel array to the storage nodes 315 of the pixel array, the storage nodes are effectively reset. Once the accumulated charges are stored in the storage nodes 315 of the pixel array, the charges are transferred to the floating diffusion region 330 row by row as described above. As illustrated by a comparison of the $t_{SN}$s of FIGS. 4 and 5, the global storage node reset 505 resulted in reduced amount of time between the two resets of the storage node. For example, $t_{SN1}$ of FIG. 5 is less than $t_{SN1}$ of FIG. 4. Reducing the amount of time the charge is stored in the storage node reduces the affects of dark current and smear current on the stored charges. Ideally, the global storage node reset 505 occurs immediately prior to the global transfer of the charge from the photosensors 310 to the storage nodes 315. As illustrated in FIG. 5, a disadvantage of using both a global storage node reset 505 and the rolling reset 405 to reset the storage nodes, is that the times for which the charges are stored in the storage nodes ($t_{SN}$) varies row by row. For example, the time $t_{SN1}$, the time charge is stored in the storage nodes of the pixels associated with row 1, is less than the time $t_{SN2}$ which is the time charge is stored in the storage nodes of the pixels associated with row 2, which is less than the time $t_{SNn}$, the time charge is stored in the storage nodes of the pixels associated with row n.

Figure 6:
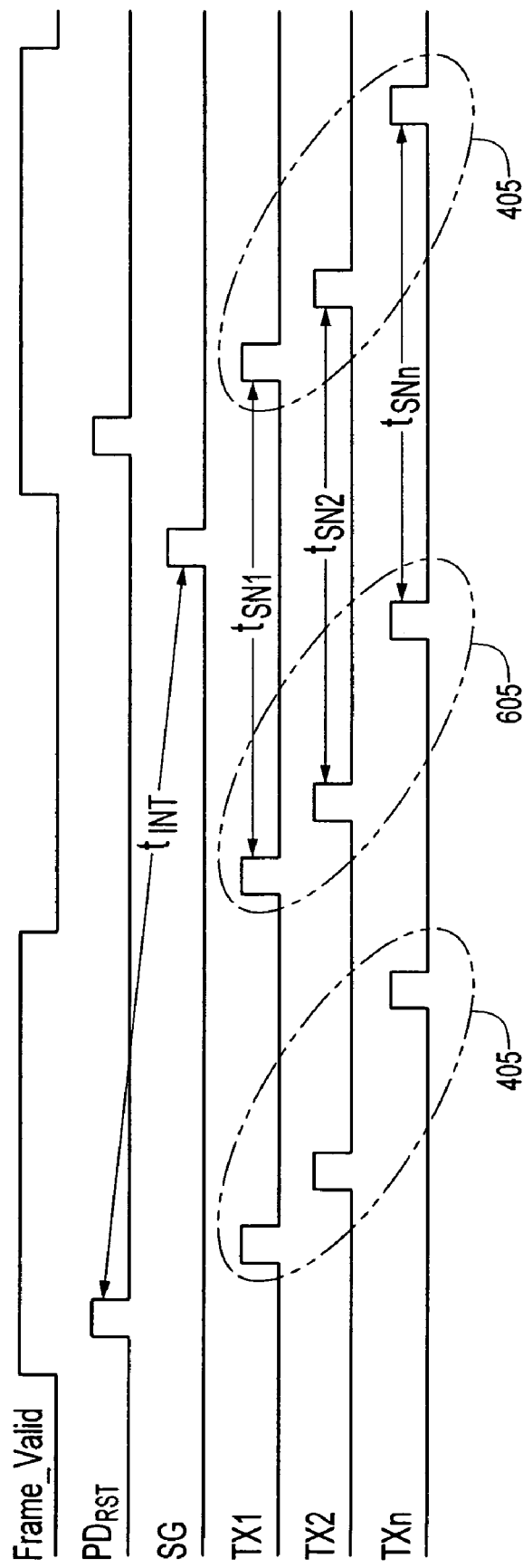
FIG. 6 is a timing diagram of charge storage for a global storage using a rolling double reset of an exemplary embodiment of the present invention.

FIG. 6 illustrates the timing of charge storage for a global storage operation using a rolling double reset in accordance with an exemplary embodiment of the present invention. As illustrated, rolling reset 405 occurs as the storage nodes 315 of the pixel circuits 300 of each row are effectively reset when transfer transistor 325 is pulsed on and the charge stored in the storage node 315 is transferred from the storage node 315 to the floating diffusion region 330. In this exemplary embodiment, the global storage node reset 505 illustrated in FIG. 5, in which each of the storage nodes 315 were reset prior to shutter gate 305 being pulsed on, is replaced with a rolling shutter reset 605. The rolling shutter reset 605 ensures that each of the storage nodes 315 are reset prior to the global transfer of the charge accumulated in each of the photosensors 310 of the pixel array to the storage nodes 315 of the pixel array. In addition, the timing of the storage node resets of each rows of the rolling shutter reset 605 is such that the amount of time that the charge is stored in each of the storage nodes is identical or nearly identical across the rows. Stated differently, the use of the rolling shutter reset 605 and the rolling reset 405 together (the combination of the rolling shutter reset and the rolling reset are referred to as a "rolling double reset") result in $t_{SN1}=t_{SN2}=t_{SNn}$ as shown in FIG. 6. Since each of these times are identical, or nearly identical, the effects of the dark current or leakage charge should be the same for each row, in other words, the image shading is eliminated. The rolling shutter reset 605 occurs at a set time after the readout for a given row. This time is approximately equal to the vertical blanking (VBlank) time. Additionally, the length of time between resets of the storage node $t_{SN}$ is minimized to reduce the effects of dark current and leakage charge.

Figure 7:
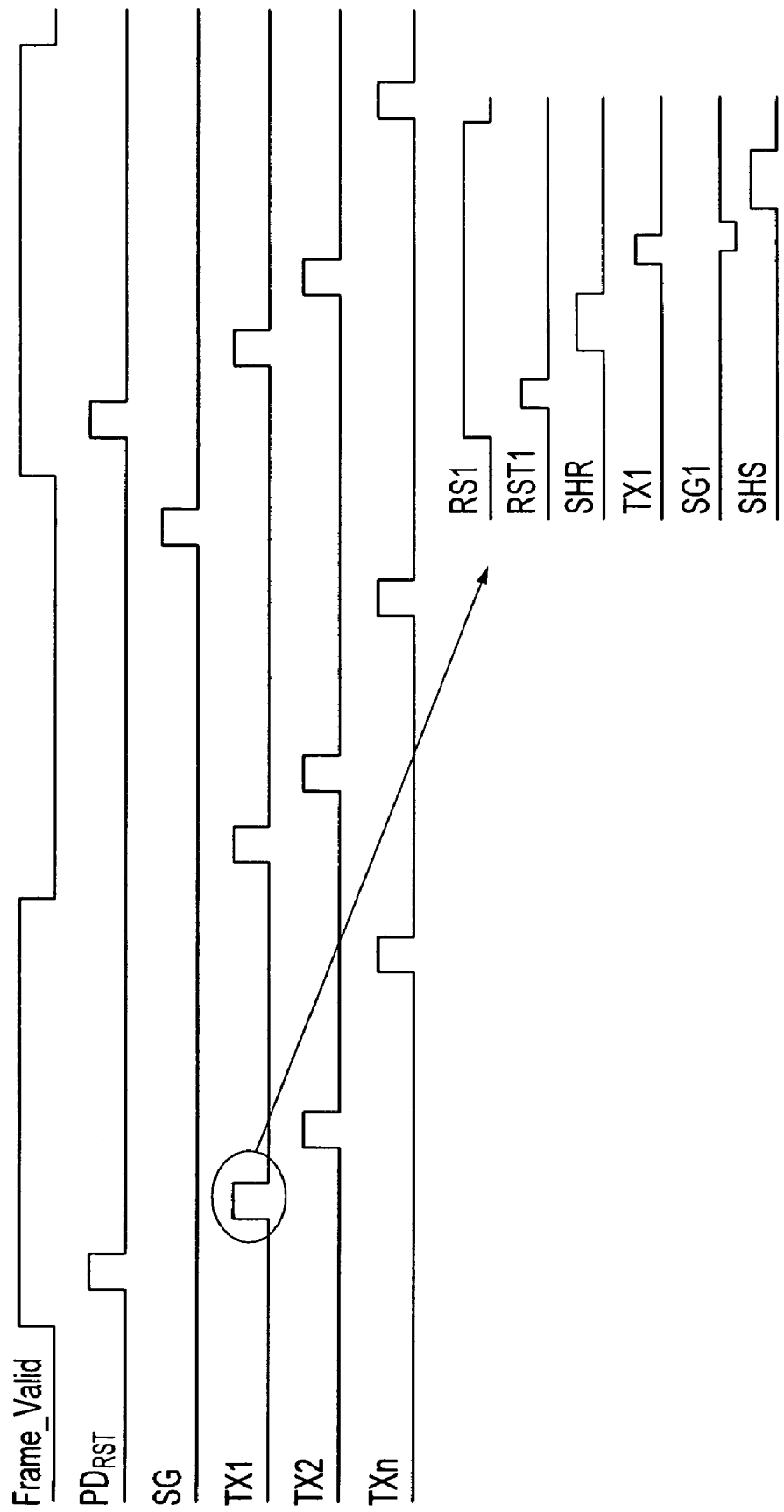
FIG. 7 is a detailed timing diagram for the rolling reset of an exemplary embodiment of the present invention during pixel readout.

FIG. 7 is a detailed timing diagram for the rolling reset 405 of an exemplary embodiment of the present invention during pixel readout. With respect to FIG. 7, RS1, RST1, TX1 and SG1 all indicate a specific row or a connected portion of transistors in a shared architecture. The RS1 control signal is pulsed, turning on the row select transistor 345. Reset transistor 335 is briefly turned on, thereby resetting floating diffusion region 330 to a predetermined voltage. The charge on the floating diffusion region 330 is applied to the gate of source follower transistor 340, which is translated to a voltage and subsequently sampled by sample and hold circuitry, where a pulse in sample and hold circuitry for reset readout (SHR) represents a time when the reset voltage is stored on a sample and hold capacitor.

Charge stored in storage node 315 is then transferred to floating diffusion region 330 by turning on transfer gate transistor 325. The charge on the floating diffusion region 330 is applied to the gate of source follower transistor 340, which is translated to a voltage and subsequently sampled and held by sample and hold circuitry for pixel signal readout when pulse SHS is applied. SHR and SHS indicate signals to transistors that are used for storing the reset and light signal values and may be external to the pixel circuit 300. Additionally, as shown in FIG. 7 the SG gate may be biased in a negative direction to improve transfer of the accumulated charge in the photosensor 310 to the storage node 315. Negatively biasing the SG gate is not required for practicing the exemplary embodiment of the present invention.

Figure 8:
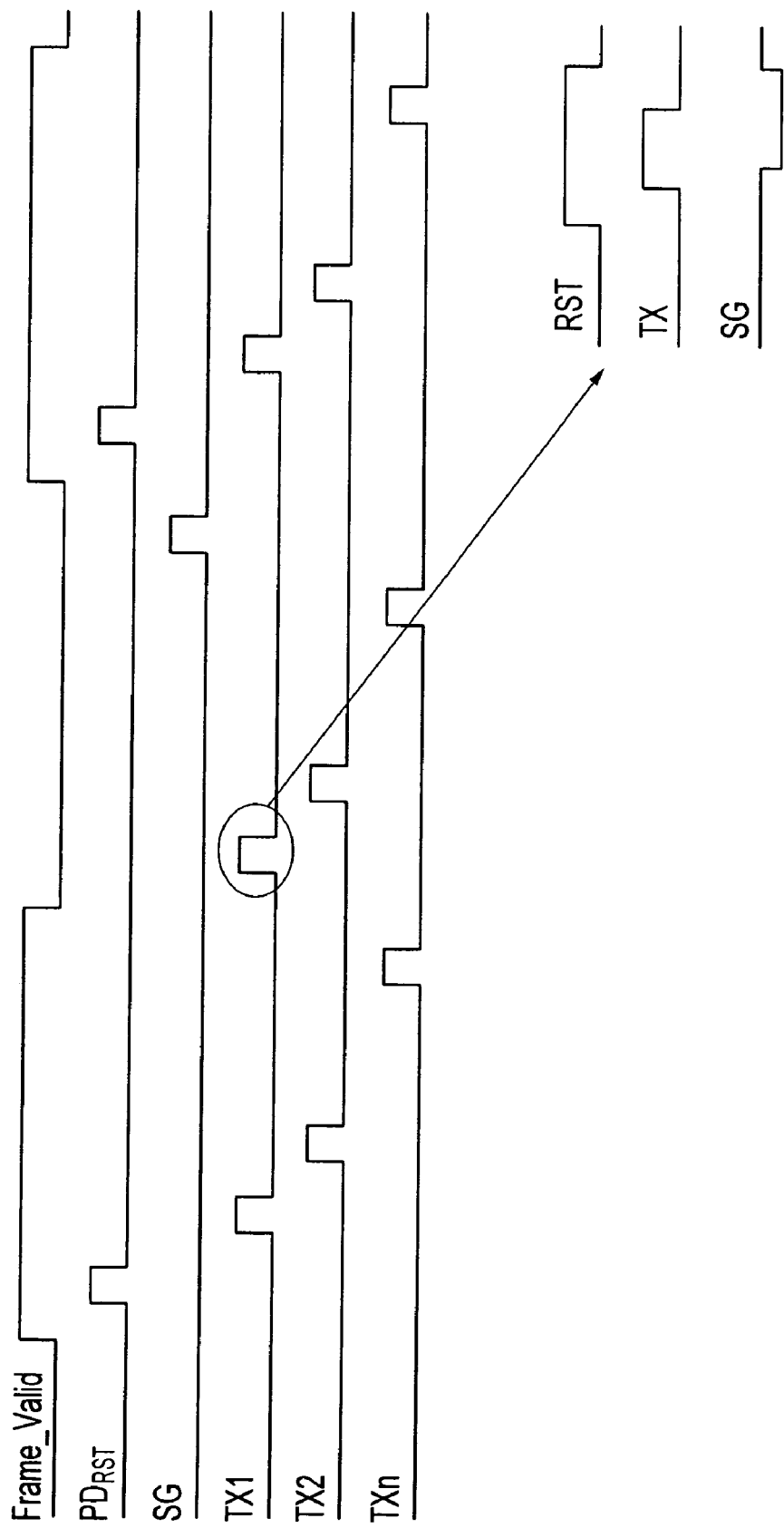
FIG. 8 is a detailed timing diagram for the rolling shutter reset of an exemplary embodiment of the present invention.

FIG. 8 is a detailed timing diagram for the rolling shutter reset 605 of the storage node 315 in accordance with an exemplary embodiment of the present invention. In FIG. 8, RST, TX and SG all indicate a specific row or connected portion of transistors in a shared architecture for rolling storage node reset. As shown, while reset transistor 335 is biased on, transfer transistor 325 is also biased on to transfer the charge on storage node 315 to the floating diffusion region and effectively reset the storage nodes 315 of a row of pixel circuits. As shown in FIG. 8 the SG gate may be biased in a negative direction to improve transfer of the accumulated charge in the photosensor 310 to the storage node 315. Negatively biasing the SG gate is not required for practicing the exemplary embodiment of the present invention.

Figure 9:
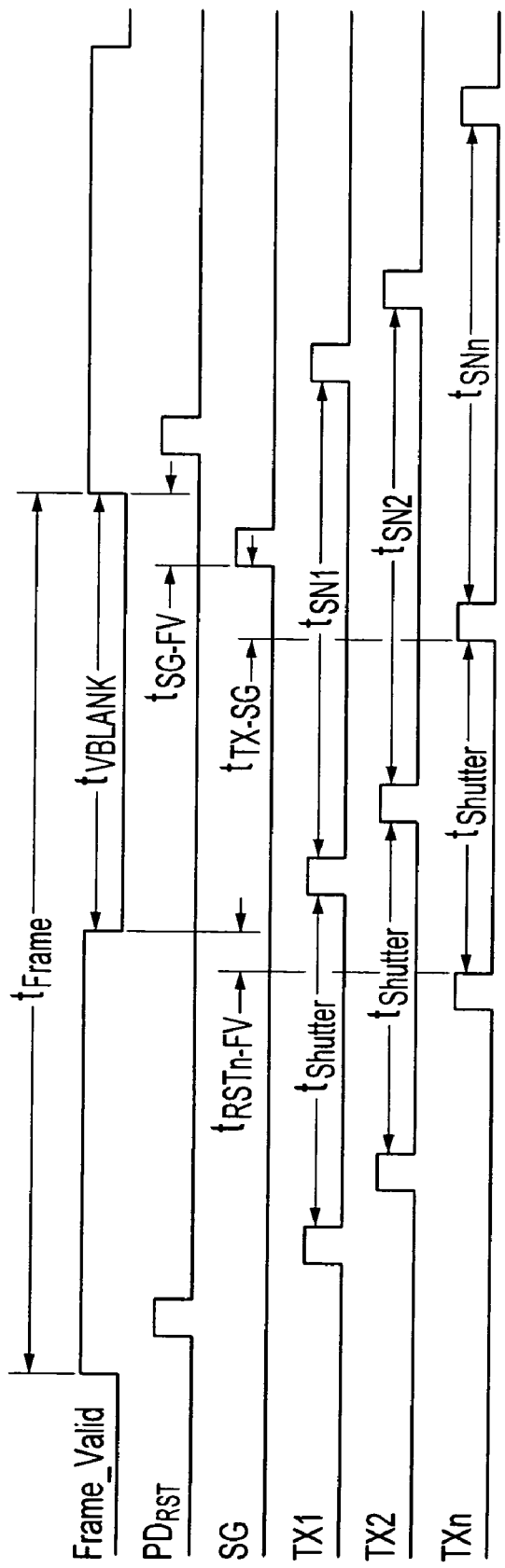
FIG. 9 is a timing diagram which illustrates a method for calculating shutter width for an exemplary embodiment of the present invention.

FIG. 9 is a timing diagram which illustrates an exemplary method for calculating tShuuer which is the time interval from when the charge is read from the storage node during the rolling reset 405 and when the storage node is reset during the rolling shutter reset 605. As illustrated, $t_{Frame}$ is equal to the time period when Frame_Valid is high plus the time Frame_Valid is low. In an exemplary embodiment, $t_{shutter}$ is equal to $t_{VBLANK}$-$t_{SG-FV}$-$t_{TX-SG}$+$t_{RSTn-FV}$. In this equation, $t_{VBLANK}$ equals the time period when Frame_Valid is low, $t_{SG-FV}$ is the time difference between the beginning of the pulse time of the shutter gate and the time until the start of the following Frame_Valid, $t_{TX-SG}$ is the time difference between the pulse time of the transfer transistor and the pulse time of the shutter gate and $t_{RSTn-FV}$ is the time difference between the time from the final reset in the rolling readout to the time when the Frame_Valid goes low. As described and illustrated in FIG. 9, the time associated with vertical blanking is equal to the time when Frame_Valid is low. Also as illustrated in FIG. 9, $t_{SN}$=$t_{Frame}$-$t_{shutter}$.

For example, for a sensor with a readout time of 16 ms (60 frames/sec), at an integration time of 100 ms, with a shutter gate dark current of 2000 e/s (at 55 degrees Centigrade) and a shutter gate leakage of 0.05V/lux*sec (95% shutter efficiency) the total dark signal and shutter gate leakage with normal timing as described in FIG. 4 is calculated as follows:

Dark signal=100 $m$×2000=200$e$ $IDK_{Shot\,Noise}$=(Dark signal)$^{1/2}$=(200)$^{1/2}$=14$e$ $SG_{Leakage}$=(0.05×100×100$m$)/$CG$=7143$e$ where
$CG$=70 $uV/e$ and the light intensity is equal to 100 lux.

The total dark signal and shutter gate leakage with rolling double reset timing as described in FIG. 6 is calculated as follows:

Dark signal=16 $m$×2000=32$e$ $IDK_{Shot\,Noise}$=(Dark signal)$^{1/2}$=(32)$^{1/2}$=5$e$ $SG_{Leakage}$=(0.05×100×16$m$)/$CG$=1142$e$ where
$CG$=70 $uV/e$ and the light intensity is equal to 100 lux.

As shown the use of the rolling double reset timing results in an improvement of 84% reduction for total dark signal, 64% reduction in dark current shot noise and 84% reduction in shutter gate leakage. The use of rolling double reset timing results the dark current shot noise being kept at a negligible level despite the 2000 e/s dark current.

Figure 10:
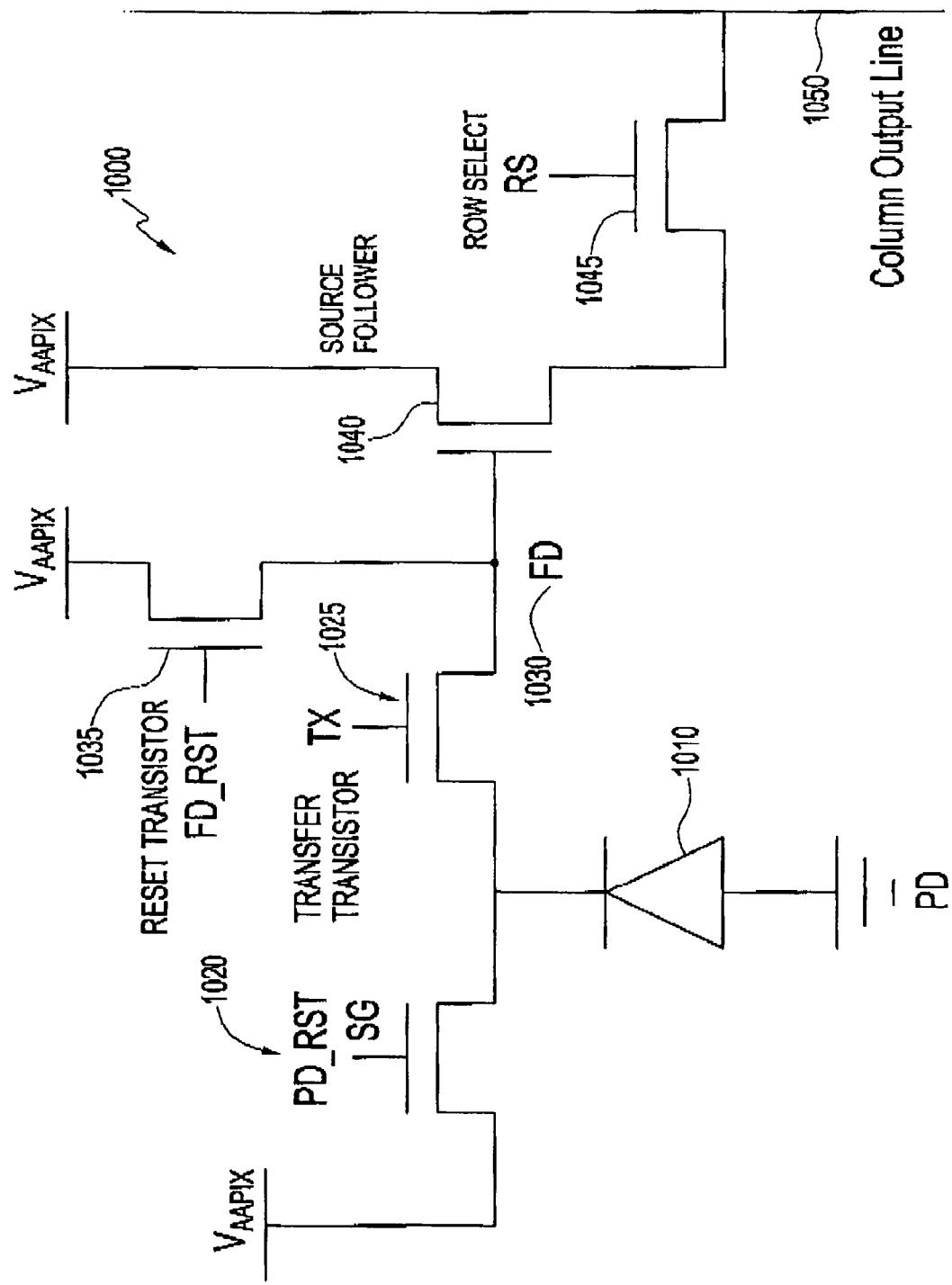
FIG. 10 is a schematic circuit diagram of an FD Global Storage imager pixel used with a global shutter function which does not utilize a separate storage node.

FIG. 10 is a schematic circuit diagram of an FD Global Storage imager pixel used with a global shutter function which stores charge in the floating diffusion node and does not utilize a separate storage node. When a global shutter is used, the charge transfers from all photosensors 1010 to the floating diffusion node 1030 for all of the pixel circuits 1000 of the pixel array at the same time. Photosensor reset ($PD_{RST}$) gate 1020 is used to reset the photosensor 1010. Transfer transistor 1025 transfers charge from the photosensor 1010 to the floating diffusion region 1030. In pixel circuit 1000, the transfer of charge from floating diffusion node 1030 to the column output line 1050 effectively resets the floating diffusion node 1030. Pixel circuit 1000 also includes reset transistor 1035, source follower transistor 1040 and row select transistor 1045.

Figure 11:
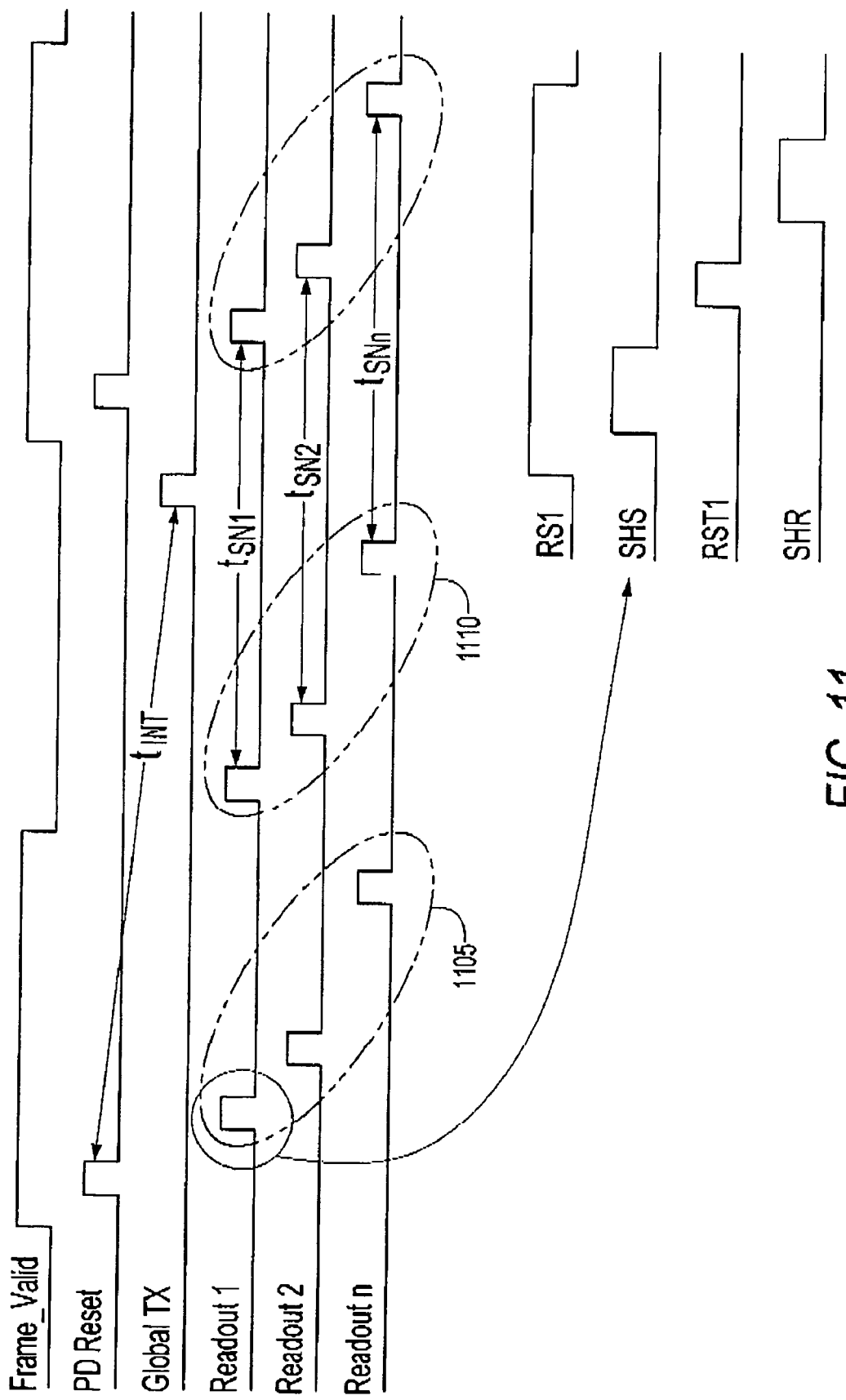
FIG. 11 is a timing diagram of charge readout for the rolling reset of an exemplary embodiment of the present invention using the FD Global Storage imager pixel of FIG. 10 including a detailed timing diagram.

FIG. 11 is a timing diagram of charge readout for the rolling reset of an exemplary embodiment of the present invention using the FD Global Storage imager pixel of FIG. 10. As illustrated, rolling reset 1105 occurs as the floating diffusion node 1030 of the pixel circuits 1000 of each row are effectively reset when row select transistor 1045 is pulsed on and the charge stored in the floating diffusion node 1030 is transferred to the column output line 1050. The rolling shutter reset 1110 ensures that each of the floating diffusion nodes 1030 are reset prior to the global transfer the charge accumulated in each of the photosensors 1010 of the pixel array to the floating diffusion nodes 1030 of the pixel array. In addition, the timing of the storage node resets of each row of the rolling shutter reset 1110 is such that the amount of time between the rolling shutter reset and the effective reset during the rolling readout is identical or nearly identical across the rows. Stated differently, the use of the rolling shutter reset 1110 and the rolling reset 1105 together (the combination of the rolling shutter reset and the rolling reset are referred to as a "rolling double reset") result in $t_{SN1}$=$t_{SN2}$=$t_{SNn}$ as shown in FIG. 11. Since each of these times are identical, or nearly identical, the effects of the dark current or leakage charge should be the same for each row, in other words, image shading is eliminated. The rolling shutter reset 1110 occurs at a set time after the readout for a given row. Additionally, the length of time between resets of the storage node $t_{SN}$ is minimized to reduce the effects of dark current and leakage charge.

Still referring to FIG. 11, RS1, and RST1, indicate a specific row or a connected portion of transistors in a shared architecture. The RS1 control signal is pulsed, turning on the row select transistor 1045. The charge on the floating diffusion region 1030 is applied to the gate of source follower transistor 1040, which is translated to a voltage and subsequently sampled and held by sample and hold circuitry for pixel signal readout when pulse SHS is applied. Reset transistor 1035 is briefly turned on, thereby resetting floating diffusion region 1030 to a predetermined voltage. The charge on the floating diffusion region 1030 is applied to the gate of source follower transistor 1040, which is translated to a voltage and subsequently sampled by sample and hold circuitry, where a pulse in sample and hold circuitry for reset readout (SHR) represents a time when the reset voltage is stored on a sample and hold capacitor. Reset transistor 1035 is briefly turned on, thereby resetting floating diffusion region 1030 to a predetermined voltage. The charge on the floating diffusion region 1030 is applied to the gate of source follower transistor 1040, which is translated to a voltage and subsequently sampled by sample and hold circuitry, where a pulse in sample and hold circuitry for reset readout (SHR) represents a time when the reset voltage is stored on a sample and hold capacitor.

Figure 12:
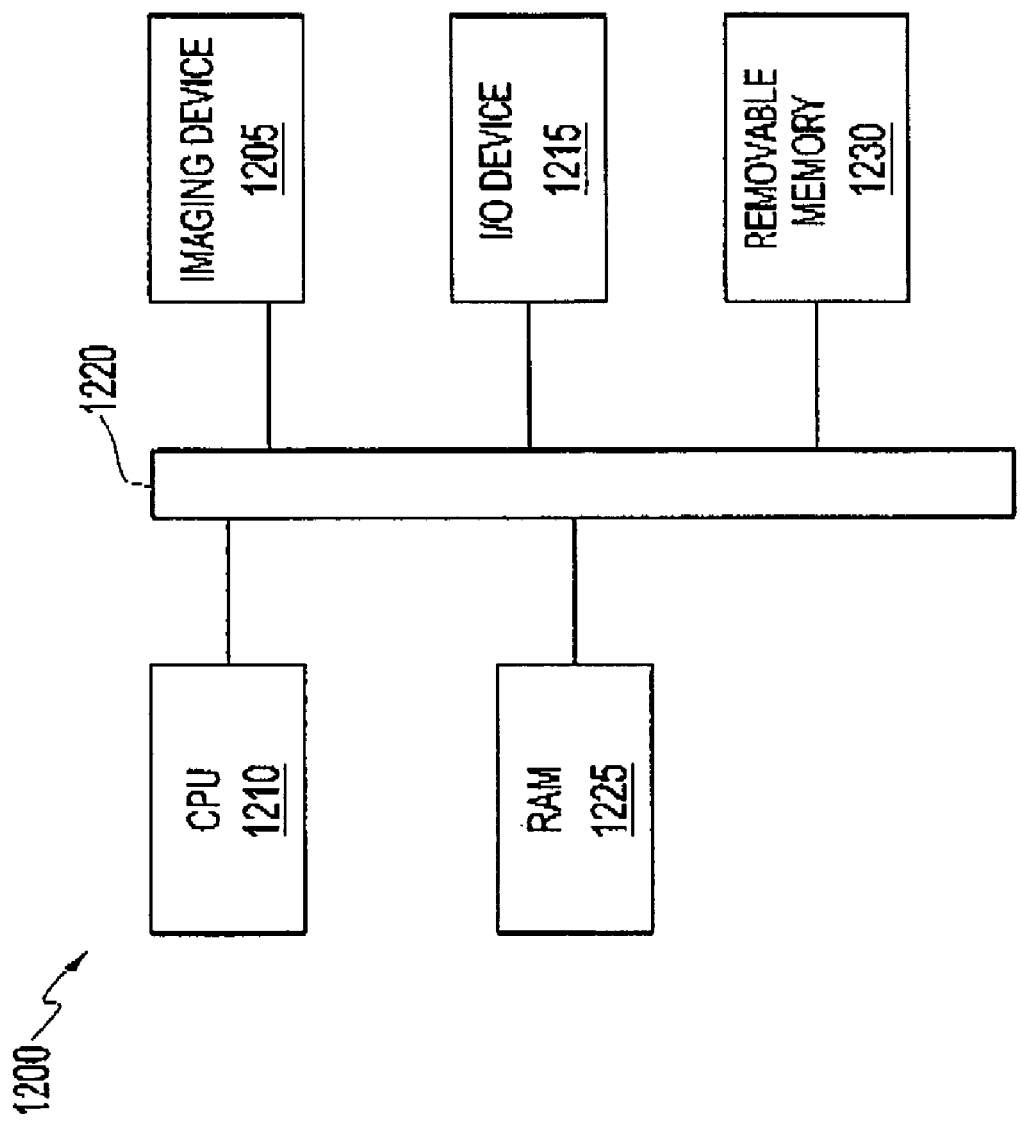
FIG. 12 illustrates a processing system incorporating the imager and the rolling double reset timing of the present invention.

FIG. 12 shows system 1200, a typical processor system modified to include an imaging device 1205 of the invention. The system 1200 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, as well as other image based systems.

System 1200, for example a camera system, generally comprises a central processing unit (CPU) 1210, such as a microprocessor, that communicates with an input/output (I/O) device 1215 over a bus 1220. Imaging device 1205 also communicates with the CPU 1210 over the bus 1220. The system 1200 also includes random access memory (RAM) 1225, and can include removable memory 1230, such as flash memory, which also communicate with the CPU 1210 over the bus 1220. The imaging device 1205 may be combined with a processor, such as a CPU, digital signal processor, or microprocessor, with or without memory storage on a single integrated circuit or on a different chip than the processor.

The devices described above illustrate typical devices of many that could be used. The above description and drawings illustrate embodiments, which achieve the objects, features, and advantages of the present invention. However, it is not intended that the present invention be strictly limited to the above-described and illustrated embodiments. Any modifications, though presently unforeseeable, of the present invention that come within the spirit and scope of the following claims should be considered part of the present invention.

What is claimed as new and desired to be protected by Letters Patent of the United States is:

1. A method of operating an array of pixels of an image sensor, each pixel having a photosensor, a first storage region and a second storage region, said array of pixels being arranged in a plurality of rows and columns, said method comprising:
   accumulating charges in said photosensors;
   using a first rolling reset to reset said first storage regions prior to transferring charges to said first storage regions;
   globally transferring said accumulated charges from said photosensors to respective ones of said first storage regions;
   transferring said accumulated charges from said first storage regions to respective ones of said second storage regions resulting in a second rolling reset of said first storage regions, said first rolling reset and said second rolling reset resulting in a rolling double reset, and
   reading out the charges residing in said second storage regions.

2. The method of claim 1 wherein said rolling double reset includes:
   resetting a first row of said first storage regions a first time prior to said transfer of said accumulated charges from said photosensors to said first storage regions;
   resetting a second row of said first storage regions a first time prior to said transfer of said accumulated charges from said photosensors to said first storage regions;
   transferring said accumulated charges stored in said first row of said first storage regions to respective ones of said second storage regions and effectively resetting a second time said first row of said second regions; and
   transferring said accumulated charges stored in said second row of said first storage regions to respective ones of said second storage regions and effectively resetting a second time said second row of said second storage regions.

3. The method of claim 2 wherein an elapsed time between said first reset of said first row of said first storage regions and said second reset of said first row of said first storage regions is approximately equal to an elapsed time between said first reset of a second row of said first storage regions and said second reset for said second row of said first storage regions.

4. A pixel array in combination with a controller for use in an imaging device, said pixel array comprising:
   a plurality of photosensors for generating charge during an integration period;
   a plurality of shutter transistors, each shutter transistor configured to transfer charge from a respective photosensor;
   a plurality of storage nodes, each node coupled to a respective shutter transistor and configured to store charge transferred from a respective one of said plurality of photosensors;
   a plurality of transfer gates, each transfer gate configured to transfer a charge during a rolling readout from a respective storage node including a first reset of the respective storage node;
   a plurality of floating diffusion regions, each floating diffusion region connected to one of said plurality of transfer gates for receiving charge from respective storage nodes;
   a plurality of readout circuits, each readout circuit connected to a respective floating diffusion regions to output charge accumulated at the floating diffusion region; and
   said controller configured to perform a global transfer of accumulated charges residing in said plurality of photosensors and configured to perform a rolling shutter reset of the plurality of storage nodes such that each storage node is reset prior to the transfer of the charge from the respective photosensor and wherein an elapsed time between said first reset of a first row of said pixel array and said rolling shutter reset of said first row of said pixel array is approximately equal to an elapsed time between said first reset of a second row of said pixel array and said rolling shutter reset of said second row of said pixel array.

5. The imaging system of claim 4 wherein the time period from the rolling shutter reset of the plurality of storage nodes to the reset which occurs during the rolling readout of the plurality of storage nodes is consistent.

6. A method of operating an array of pixels of an image sensor, each pixel having a photosensor, a floating diffusion node, and a column output line, said array of pixels being configured as a plurality of rows and columns, said method comprising:
   accumulating charges in said photosensors;
   using a first rolling reset to reset said floating diffusion nodes prior to transferring charges to said floating diffusion nodes;
   globally transferring said accumulated charges from said photosensors to respective ones of said floating diffusion nodes; and
   transferring said accumulated charges from said floating diffusion nodes to respective ones of said column output lines resulting in a second rolling reset of said first floating diffusion nodes, said first rolling reset and said second rolling reset resulting in a rolling double reset.

7. The method of claim 6 wherein said rolling double reset includes:
   resetting a first row of said floating diffusion nodes a first time prior to said transfer of said accumulated charges from said photosensors to said floating diffusion nodes;
   resetting a second row of said floating diffusion nodes a first time prior to said transfer of said accumulated charges from said photosensors to said floating diffusion nodes;
   transferring said accumulated charges stored in said first row of said floating diffusion nodes to respective ones of said column output lines and effectively resetting a second time said first row of said floating diffusion nodes; and
   transferring said accumulated charges stored in said second row of said floating diffusion nodes to respective ones of said column output lines and effectively resetting a second time said second row of said floating diffusion nodes.

8. The method of claim 7 wherein an elapsed time between said first reset of said first row of said floating diffusion nodes and said second reset of said first row of said floating diffusion nodes is approximately equal to an elapsed time between said first reset of a second row of said floating diffusion nodes and said second reset for said second row of said floating diffusion nodes.

* * * * *